United States Patent
Sadd et al.

(10) Patent No.: US 7,906,805 B2
(45) Date of Patent: Mar. 15, 2011

(54) REDUCED-EDGE RADIATION-TOLERANT NON-VOLATILE TRANSISTOR MEMORY CELLS

(75) Inventors: Michael Sadd, Austin, TX (US); Fethi Dhaoui, Patterson, CA (US); John McCollum, Saratoga, CA (US); Richard Chan, Los Altos, CA (US)

(73) Assignee: Actel Corporation, Mountain View, CA (US)

( * ) Notice: Subject to any disclaimer, the term of this patent is extended or adjusted under 35 U.S.C. 154(b) by 12 days.

(21) Appl. No.: 12/196,978

(22) Filed: Aug. 22, 2008

(65) Prior Publication Data

US 2010/0044768 A1    Feb. 25, 2010

(51) Int. Cl.
*H01L 29/788* (2006.01)
(52) U.S. Cl. .................. 257/316; 257/317; 257/E29.129
(58) Field of Classification Search .................. 257/315, 257/316, 317, E29.129
See application file for complete search history.

(56) References Cited

U.S. PATENT DOCUMENTS

| | | | | |
|---|---|---|---|---|
| 5,420,449 | A * | 5/1995 | Oji ................................ | 257/307 |
| 5,468,981 | A * | 11/1995 | Hsu ................................ | 257/316 |
| 5,998,264 | A * | 12/1999 | Wu ................................ | 438/260 |
| 6,008,090 | A * | 12/1999 | Wu ................................ | 438/260 |
| 6,048,768 | A * | 4/2000 | Ding et al. ....................... | 438/264 |
| 6,103,577 | A * | 8/2000 | Horng ............................ | 438/262 |
| 6,174,777 | B1 * | 1/2001 | Jang ............................... | 438/299 |
| 6,177,304 | B1 * | 1/2001 | Li et al. ........................... | 438/233 |
| 6,452,835 | B1 * | 9/2002 | Diorio et al. ............. | 365/185.03 |
| 6,611,032 | B2 * | 8/2003 | Schuegraf et al. ............ | 257/412 |
| 6,908,803 | B2 * | 6/2005 | Schuegraf et al. ............ | 438/201 |
| 7,282,759 | B2 * | 10/2007 | Kim et al. ....................... | 257/315 |
| 2001/0035541 | A1 * | 11/2001 | Schuegraf et al. ............ | 257/288 |
| 2002/0055217 | A1 * | 5/2002 | Kanamori ....................... | 438/221 |
| 2008/0142870 | A1 * | 6/2008 | Watanabe ....................... | 257/316 |
| 2009/0039408 | A1 * | 2/2009 | Hatano et al. ................. | 257/316 |
| 2009/0267130 | A1 * | 10/2009 | Zhu ................................ | 257/316 |

OTHER PUBLICATIONS

Byun, Young Hee et al., "An Amorphous Silicon TFT with Annular-Shaped Channel and Reduced Gate-Source Capacitance," IEEE Transactions on Electron Devices, May 1996, vol. 43, No. 5, pp. 839-841.

Champion, Corbin L et al., "Accurate SPICE Models for CMOS Analog Radiation-Hardness-by-Design," IEEE Transactions on Nuclear Science, Dec. 2005, vol. 52, No. 6, pp. 2542-2549.

Chen, Shiao-Shien et al., "A Comparison of Floating-Body Potential in H-Gate Ultrathin Gate Oxide Partially Depleted SOI pMOS and nMOS Devices Based on 90-nm SOI CMOS Process," IEEE Electron Device Letters, Apr. 2004, vol. 25, No. 4, pp. 214-216.

(Continued)

*Primary Examiner* — Ngan Ngo
(74) *Attorney, Agent, or Firm* — Lewis and Roca LLP (57) ABSTRACT

An edgeless one-transistor flash memory array includes transistors that have two polysilicon gate layers that overlay an active region. The bottom polysilicon gate layer is electrically isolated. The memory is configured such that current passes from drain to source under the bottom polysilicon layer, such that it does not approach a field oxide region. An edgeless two-transistor programmable memory includes memory cells that have two active devices. Two polysilicon gate layers overlay two active regions and are shared between the two active devices. One of the devices is used to program and erase the cell while the other used as a programmable switch in a programmable logic device. The bottom polysilicon gate layer is electrically isolated. The memory is configured such that current passes from drain to source under the bottom polysilicon layer, such that it does not approach a field oxide region.

17 Claims, 7 Drawing Sheets

OTHER PUBLICATIONS

Li, Ying et al., "Anomalous Radiation Effects in Fully Depleted SOI MOSFETs Fabricated on SIMOX," IEEE Transactions on Nuclear Science, Dec. 2001, vol. 48, No. 6, pp. 2146-2151.

Snoeys, Walter et al., "A New NMOS Layout Structure for Radiation Tolerance," IEEE Transaction on Nuclear Science, Aug. 2002, vol. 49, No. 4, pp. 1829-1833.

Snoeys W. et al., "Layout Techniques to Enhance the Radiation tolerance of Standard CMOS Technologies Demonstrated on a Pixel Detector Readout Chip," Nuclear Instruments and Methods in Physics Research A 439, 2000, pp. 349-360.

Van den Bosch, Anne et al., "A High-Density, Matched Hexagonal Transistor Structure in Standard CMOS Technology for High-Speed Applications," IEEE Transactions on Semiconductor Manufacturing, May 2000, vol. 13, No. 2, pp. 167-172.

* cited by examiner

REDUCED-EDGE RADIATION-TOLERANT NON-VOLATILE TRANSISTOR MEMORY CELLS

BACKGROUND OF THE INVENTION

1. Field of the Invention

The present invention relates to non-volatile memory cells. More particularly, the present invention relates to reduced-edge, radiation-tolerant, non-volatile transistor cells for memories or programmable logic devices.

2. The Prior Art

Reduced edge transistors such as so-called "H-gates" used in regular logic have been employed to increase radiation tolerance of such circuits. A special case of reduced edge transistors is so-called "edgeless" transistors. Edgeless or circle-gate transistors have also been used in logic and other peripheral circuits and charge pumps to eliminate increased leakage due to exposure to ionizing radiation. Although such radiation-hardening techniques have been applied to standard single-polysilicon-gate devices, they have not been applied to programmable non-volatile memories.

Antifuse-based radiation tolerant products available from Actel Corp. of Mountain View, Calif. include edgeless regular and high-voltage transistors to minimize the effects of ionizing radiation. A channel-stop implant may also be introduced under the field edge to suppress leakage, but this requires a specialized process.

Non-volatile transistors used in flash memories are traditionally n-channel transistors with two gates. The upper gate is typically known as the control gate while the bottom gate is known as the floating gate. The floating gate is typically made of conductively doped polysilicon, but it is electrically isolated from the control gate above and the transistor active area below, as well as from all other circuits on the integrated circuit by means of sufficiently thick silicon dioxide. The floating gate can be thought of as a charge storage layer (or charge storage region) interposed between the control gate above and the active silicon region underneath. The terms "charge storage region" and "charge storage layer" are used interchangeably herein, though the former is typically used in this disclosure to emphasize the lateral area of a flash transistor covered by the material while the later is typically used to emphasize the vertical relationships between the layers comprising a flash transistor. Electrical charge is added or removed from the floating gate to effectively change the threshold voltage (sometimes called the turn-on voltage) of the transistor. Typically, since the floating gate is conductive, electrical charges are free to redistribute themselves on the floating gate. As is well known in the art, an n-channel flash transistor uses negatively charged carriers to conduct current in the channel region under the gate when the transistor is turned on by applying a higher voltage on the control gate than is applied when the transistor is turned off. By convention, for n-channel transistors the drain terminal is at the end of the channel region at the higher voltage potential while the source terminal is at the end of the channel region at the lower voltage potential.

More recently as shrinking process geometries have made floating gate non-volatile transistors less area efficient than in previous generation processes, alternative flash technologies like, for example, SONOS (an abbreviation for Silicon-Oxide-Nitride-Oxide-Silicon) and silicon nanocrystals have been introduced as alternative ways to implement the charge storage layer. These technologies typically replace the polysilicon floating gate with a layer of a non-conductive charge trapping material. By adding or removing electrical charge the threshold voltage of the transistor is changed, though the electrical charges are not free to redistribute themselves within the layer of charge trapping material.

Typically flash memories comprise arrays of flash transistors arranged in rows and columns. Often a large array is broken into a number of smaller arrays. Typically in the fabrication process long, narrow strips of active material (silicon) separated by field oxide (silicon dioxide) are laid out in a first direction spanning the array. Then the oxide forming the isolation between the charge storage layer and active silicon (also known as the "bottom oxide") is grown all over the array area. Next, the charge storage layer is laid down, again all over the array. If the charge storage layer is to be conductive, like a doped polysilicon floating gate, an additional masking step is required to remove strips of the floating gate polysilicon that run parallel to and in between the strips of active silicon. Then the oxide forming the isolation between the charge storage layer and the control gates (also known as the "top oxide") is grown all over the array, followed by the conductively doped control gate polysilicon layer. A masking step (often called the poly mask since it defines the geometries of the polysilicon conductors) is used to etch away the unwanted portions of the control gate polysilicon layer, the top oxide layer, the charge storage layer, and bottom oxide layer. The etching leaves long, narrow strips of polysilicon conductors spanning the array running in a second direction perpendicular to the long, narrow strips of active silicon running in the first direction. The active regions between the polysilicon conductors are also left exposed by the etch, and the only remnants of the original charge storage layer are aligned with and underneath the control gate polysilicon conductors.

Wherever there is an intersection of the polysilicon conductors and the active silicon, a flash transistor is formed. In floating gate technologies where the charge storage layer is conductive, there is a piece of the floating gate that covers at least the region of the active silicon where the transistor is, although it typically extends beyond the active region and into the field oxide by some amount (this extension is called an endcap). Due to the additional masking step needed to separate the floating gates, there is enough distance between the floating gate endcaps to keep them electrically isolated from one another. In technologies where the charges in the charge storage layer are not mobile, the charge storage layer runs continuously under the control gate polysilicon conductors for their entire length, but since charges in that material are immobile, the portion of the charge storage layer for each transistor is inherently isolated and the extra charge storage material over the field oxide does no harm.

In the next fabrication step, the exposed active silicon is conductively doped. If, for example, the flash transistors are to be n-channel transistors as is typically the case, then an n-type dopant is implanted in sufficient concentration to overcome the intrinsic p-type doping intrinsic to the active silicon. This leaves regions of p-type material in the active under the control gates and n-type material in the exposed active. The doping of the active region is said to be self-aligned because the polysilicon mask and the boundaries of the active material abutting the field oxide are used to define those areas of the active that are to be implanted and those that are not.

After the implantation, a layer of salicide (an abbreviation for Self-Aligned siLICIDE) is typically grown on top of the exposed active regions. This is generally a metal silicide of a type well known in the art. It is conductive, which reduces the sheet resistance of the active region and makes for a better electrical connection between the active silicon and a contact. It is also self-aligned in that the only place the salicide is grown is on the exposed active regions that received the implantation. The contacts will be used to couple the active silicon regions to a metal layer that later will be deposited above the polysilicon conductors used as the control gates. After the implantation and salicide growth, more oxide is grown and contacts, metals and vias are fabricated.

Persons skilled in the art will realize that this is a very simplified description of the semiconductor process that emphasizes the essence of the steps important for understanding the present invention. For example, many steps go into growing and planarizing a single layer of silicon dioxide or polysilicon. Similarly, many steps go into a "mask step" like, for example, covering the wafer with photoresist, aligning the mask to the wafer repeatedly for each integrated circuit location (called stepping), developing the photoresist, etching away the undesired portion of the developed photoresist, etching, cleaning, implanting, growing, etc., as appropriate for the mask step once the mask pattern of the photoresist is in place. The simplified description above is sufficient for the understanding of the present invention by such skilled persons and that the majority of details omitted are for clarity of presentation and to avoid overcomplicating the disclosure and obscuring the inventive aspects therein.

A major challenge using prior art non-volatile transistors in a radiation environment is known as Total Dose. During its lifetime in a radiation environment, a semiconductor is repeatedly hit by charged particles—both negatively charged electrons and positively charged ions of various types. Positive ions tend to become lodged in the silicon dioxide regions of the semiconductor—and are a particular problem in the Shallow Trench Isolation (STI) silicon dioxide areas used to electrically isolate transistors in modern deep-submicron processes. When they lodge at the edge of a transistor channel region (the area under the gate where the channel forms when the transistor is on), their positive charge attracts unwanted electrons into the region. This effectively lowers the threshold voltage of the transistor locally near the edges of the transistor where the STI is located and can cause current leakage along the edge of the transistor. The leakage can cause undesirable power consumption, may interfere with re-programming the cell, and, in extreme cases, may cause the off state of the transistor to read as on.

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

A flash memory array of edgeless one-transistor memory cells includes transistors that have two polysilicon gate layers that overlay an active region. The bottom polysilicon gate layer is electrically isolated. The memory is configured such that current passes from drain to source under the bottom polysilicon layer, such that it does not approach a field oxide region.

An edgeless two-transistor programmable memory includes memory cells that have two active devices. Two polysilicon gate layers overlay two active regions and are shared between the two active devices. One of the devices is used to program and erase the cell while the other is used as a programmable switch in a programmable logic device. The bottom polysilicon gate layer is electrically isolated. The memory is configured such that current passes from drain to source under the bottom polysilicon layer, such that it does not approach a field oxide region.

In one embodiment of the invention, the edge phenomenon is reduced by covering two edges of the active region with polysilicon. The edge is not eliminated, but is reduced. A shallow trench traps significant amounts of charge. In some embodiments a sidewall implant may not be available, so the channel length is made longer on that sidewall. By increasing the effective channel length in the regions of the transistor that border the field edge, the threshold voltage in those regions increases due to elimination of short-channel threshold voltage roll-off effects. This increased threshold voltage provides margin to counter the effect of positive charge trapped at the field edge caused by ionizing radiation. The effect of channel length must be sizable enough to suppress leakage due to charge trapping.

In some embodiments, the edge is eliminated by providing "edgeless" or "circle gate" polysilicon configurations. In other embodiments, the transistor edge is moved inside the active region by means of masking changes to reduce interactions with the trapped charges near the sidewall. In embodiments where a floating gate is not shared between two transistors, the floating gate may be replaced by a layer of a non-conductive charge trapping material like, for example, SONOS or silicon nanocrystals.

Figure 1A:
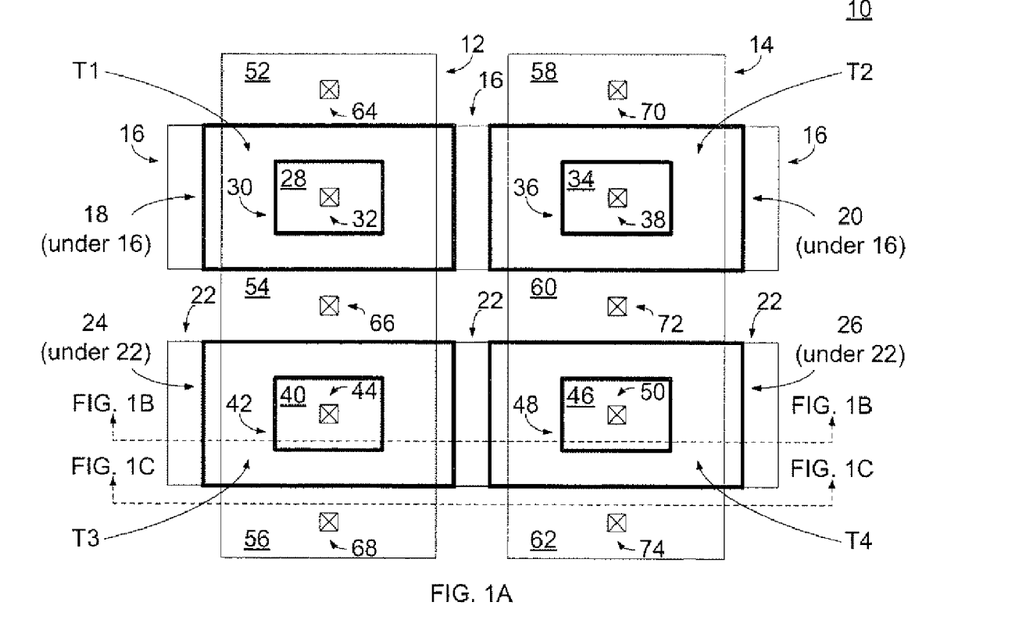
FIGS. 1A through 1C are, respectively, a top view and two cross-sectional views of a group of memory cells formed in accordance with the principles of the present invention.

In FIG. 1A, an exemplary array of reduced-edge, radiation-tolerant, flash memory cells is shown in top view in an n-type silicon substrate 10. For simplicity, the array has four transistors T1, T2, T3 and T4 arranged in two rows and two columns, but other numbers of rows and columns may be used. Persons skilled in the art will realize that substrate 10 may also be a deep n-well inside a p-type silicon substrate as a matter of design choice.

Substrate 10 contains two p-wells 12 and 14 running vertically through the array in FIG. 1A. These p-wells are also known as active regions because they are where any active devices (e.g., transistors) will be made. Two doped polysilicon conductors 16 and 22 run horizontally across the array. The four flash transistors occur at the intersections of polysilicon conductors 16 and 22 and p-wells 12 and 14. Four floating gates 18, 20, 24 and 26 (associated with transistors T1, T2, T3 and T4 respectively) are shown with a heavy line defining their boundaries in FIG. 1A for ease of identification. Floating gates 18 and 20 are completely underneath polysilicon conductor 16 while floating gates 24 and 26 are completely underneath polysilicon conductor 22.

The upper left transistor T1 in FIG. 1A has a drain region 28, which is defined by aperture 30 in polysilicon conductor 16 and floating gate 18. Contact 32 couples drain region 28 to a metal layer disposed upon the integrated circuit above the polysilicon conductors. The metal layer is not shown in FIG. 1A (or in any other figure) to avoid overcomplicating the disclosure and obscuring the inventive aspects therein. The upper right transistor T2 in FIG. 1A has a drain region 34 defined by aperture 36 in polysilicon conductor 16 and floating gate 20. Contact 38 couples drain region 34 to a metal layer disposed upon the integrated circuit above the polysilicon conductors. The lower left transistor T3 in FIG. 1A has a drain region 40, which is defined by aperture 42 in polysilicon conductor 22 and floating gate 24. Contact 44 couples drain region 40 to a metal layer disposed upon the integrated circuit above the polysilicon conductors. The lower right transistor T4 in FIG. 1A has a drain region 46, which is defined by aperture 48 in polysilicon conductor 22 and floating gate 26. Contact 50 couples drain region 46 to a metal layer disposed upon the integrated circuit above the polysilicon conductors.

Polysilicon conductors 16 and 22 divide p-well 12 into three separate source regions 52, 54 and 56, which are coupled to a metal layer above the polysilicon conductors through contacts 64, 66 and 68. Similarly, polysilicon conductors 16 and 22 also divide p-well 14 into three separate source regions 58, 60 and 62, which are coupled to a metal layer above the polysilicon conductors through contacts 70, 72 and 74.

Figure 1B:
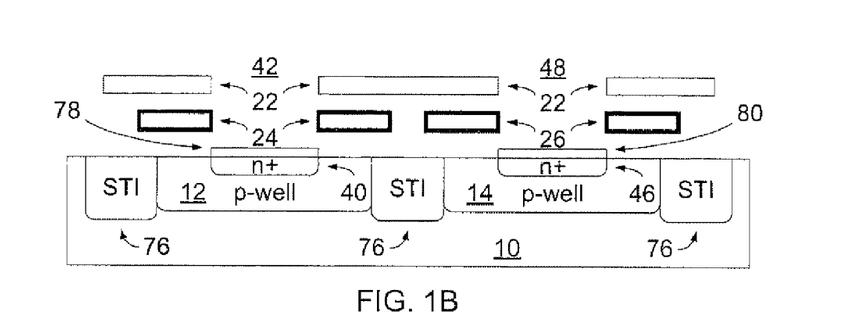
Figure 1C:
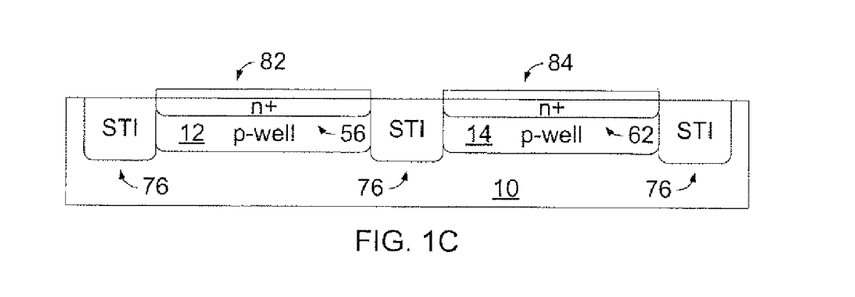

In order to more fully describe the three dimensional structure depicted in FIG. 1A, two cross sections in the planes designated by the dotted lines labeled FIG. 1B and FIG. 1C are shown in FIG. 1B and FIG. 1C respectively. Turning to FIG. 1B the cross section includes substrate 10, p-wells 12 and 14, polysilicon conductor 22, floating gates 24 and 26, drain region 40 located under aperture 42, and drain region 46 located under aperture 48 that have been previously described. The annular nature of the polysilicon is shown here, since polysilicon conductor 22, which forms the control gate for transistors T3 and T4 in FIG. 1A, appears as three separate pieces in FIG. 1B even though it is a single annular piece of polysilicon as shown in FIG. 1A. Similarly the floating gates 24 and 26 each appears as two separate pieces in FIG. 1B even though each is a single annular piece of polysilicon.

Also shown in FIG. 1B are Shallow Trench Isolation regions 76, which are the silicon dioxide (or field oxide) regions that isolate the p-wells 12 and 14 from each other and any other adjacent wells in conjunction with substrate 10. Since these are n-channel transistors, drain regions 40 and 46 labeled n+ in the figure indicating the type of doping (n-type in high concentration) performed during the fabrication of the regions. Drain regions 40 and 46 are shown separated by a distance from the STI regions 76 on either side of p-wells 12 and 14 respectively. This is due to the self-aligning nature of the drain implantation process. Only exposed active silicon p-well areas not underneath the polysilicon conductors receive the n+ implant. The need for a high concentration is to overcome the relatively light p-type doping of p-wells 12 and 14 to create n-type regions within them. Similarly, salicide areas 78 and 80 are shown as a layer on top of drain regions 40 and 46 respectively in FIG. 1B. The salicide is a conductive layer of metal silicide, which is only grown on top of an active region exposed by the polysilicon. Any of a number of metals known in the art like, for example, titanium, cobalt, nickel, platinum, or tungsten may be used. Those skilled in the art will appreciate that the exposing of the active p-well regions is only temporary immediately following the polysilicon mask etching step. After the active regions are implanted and the salicide grown, more silicon dioxide is grown on top of the entire memory array and the processing continues until the integrated circuit is completely manufactured.

Turning to FIG. 1C the cross section includes substrate 10, p-wells 12 and 14, source regions 56 and 62, and STI regions 76, which have been previously described. Like drain regions 40 and 46 in FIG. 1B, source regions 56 and 62 also receive the n+ implant and get a layer of salicide (indicated by reference numbers 82 and 84 in the figure) wherever the active silicon forming p-wells 12 and 14 is exposed by the absence of polysilicon conductors. Because there is no polysilicon in the cross section illustrated in FIG. 1C, the n+ source region 56 and its salicide layer 82 extend completely across the width of p-well 12 from the STI region 76 on one side to the STI region 76 on the other. Similarly, the n+ source region 62 and its salicide layer 84 extend completely across the width of p-well 14.

Returning to the top view in FIG. 1A, all of the exposed source regions 52, 54, 56, 58, 60 and 62 as well as the exposed drain regions 28, 34, 40 and 46 will receive the n+ implant and be covered with salicide because they are the only active silicon regions in the exemplary array not covered by polysilicon after the polysilicon mask etch. Each of the four transistors T1, T2, T3 and T4 has a single drain region and two source regions, with the source region 54 being shared by transistors T1 and T3 and the source region 60 being shared by transistors T2 and T4. Since in most memory operations the two source nodes of each transistor would be operated at the same voltage, the structure behaves like a single transistor. If the source nodes are operated at different voltages, then the structure behaves like two separate transistors commonly connected at the gate and drain nodes each operating in a substantially identical way, albeit differently at any given time in response to the different voltages on the source nodes. Persons skilled in the art will realize that while both the source and the drain terminals may exchange roles during operation, that the designation of some terminals as source terminals and other terminals as drain terminals in the case of asymmetrical transistor layouts is a function of the address, program, erase, and read circuits coupled to the array. Many such circuits suitable for use with the present invention are known in the art and are not discussed to avoid overcomplicating the disclosure.

Looking at transistor T3 in more detail, the distance between drain region 40 and source region 54 is defined by the width of the polysilicon conductor 22 and the floating gate 24 between them. Similarly, the distance between drain region 40 and source region 56 is defined by the width of the polysilicon conductor 22 and the floating gate 24 region between them. These distances are a matter of design choice, but are at or near the minimum channel length the process design rules allow for flash transistors in any given design, since a short channel length is the most area efficient way to attain a transistor with strong current drive. In deep-submicron processes, short channel devices have lower threshold voltages than transistors laid out with a longer channel. Thus in the structure of FIG. 1A, the threshold voltage underneath floating gate 24 will vary with location. Areas between the drain region 40 and the two source regions 54 and 56 will have lower threshold voltages than areas between drain region 40 and the STI regions 76, because the effective channel length in the areas near the STI regions 76 is longer due to the geometry of transistor T3.

When the transistor T3 is turned on, a channel will form under the entire area under floating gate 24, but the degree of inversion will be significantly lower in the longer channel regions and significantly higher in the short channel areas. The current path through transistor T3 is from contact 44 to contacts 66 and 68. Since the current will take the path of least resistance, the current will flow through the short channel region and not approach the STI regions 76, since the short channel region provides a shorter path with a lower sheet resistance under the charge storage region than the longer channel regions. This is true even if a substantial number of positively charged particles are lodged in the STI regions 76 nearest drain region 40, which will tend to lower the threshold voltage in those regions nearest the STI.

When transistor T3 is turned off, no inversion will take place and no channel will form. The increased threshold voltage in regions under floating gate 24 will counteract the effects of a substantial number of positively charged particles if they become lodged in the STI regions 76 nearest drain region 40, which will tend to lower the threshold voltage in the active regions nearest the STI. This will substantially reduce the amount of leakage through transistor T3 and extend its useful lifetime in a radiation environment. Since the geometry of transistors T1, T2 and T4 is substantially identical to the geometry of transistor T3, they will show substantially identical behavior.

The embodiment in FIG. 1A employed conductive polysilicon floating gates as the charge storage region, but the same basic device geometry can be employed using a non-conductive charge storage material like, for example, SONOS or silicon nanocrystals. In such an implementation, the floating gates 18 and 20 would be replaced by a continuous layer of charge storage material underneath and aligned with polysilicon conductor 16, which runs the length of the array. Similarly, floating gates 24 and 26 would be replaced by a continuous layer of charge storage material underneath and aligned with polysilicon conductor 22, which runs the length of the array. In the regions where polysilicon conductors 16 and 22 pass over active silicon, the charge storage region would function in a substantially similar fashion to the way the floating gates functioned in the embodiment of FIG. 1A. In the regions where polysilicon conductors 16 and 22 pass over STI regions 76, the charge storage layer would be present but there would be no way to add or remove charge (since this is typically done through either the top or bottom gate oxide of the flash transistors) and the non-conductivity of the layer would assure the independence of the charge storage regions of adjacent transistors disposed along a single polysilicon conductor. In such a flash transistor with a non-conductive charge storage region, the drive currents when on and the leakage currents when off would behave in substantially the same way.

Figure 2A:
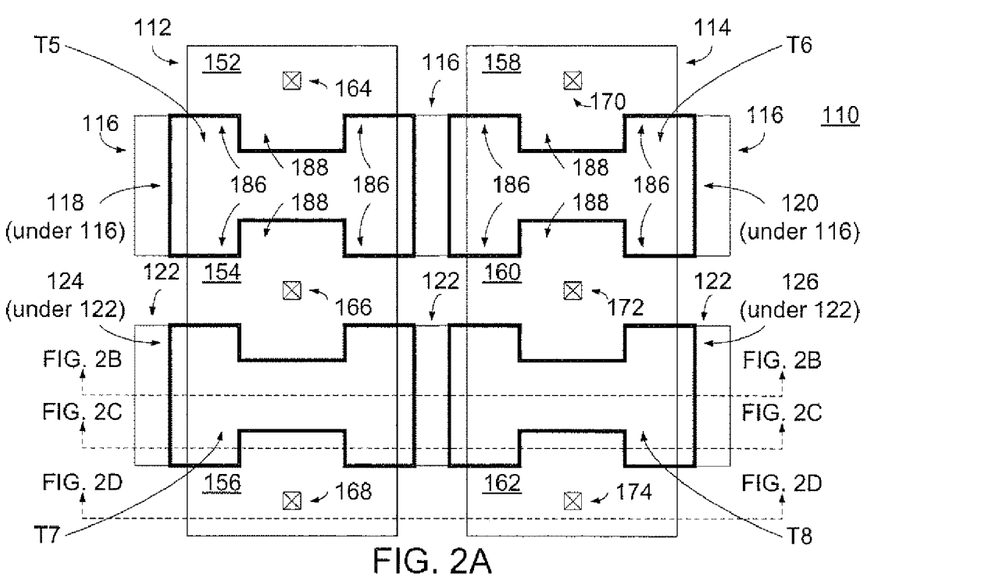
FIGS. 2A through 2D are, respectively, a top view and three cross-sectional views of a group of memory cells formed in accordance with the principles of the present invention.

Turning to FIG. 2A, an exemplary array of reduced-edge, radiation-tolerant, flash memory cells is shown in top view in an n-type silicon substrate 110. For simplicity, the array has four transistors T5, T6, T7 and T8 arranged in two rows and two columns, but other numbers of rows and columns may be used. Persons skilled in the art will realize that n-type substrate 110 may also be a deep n-well inside a p-type silicon substrate as a matter of design choice.

Substrate 110 contains two p-wells 112 and 114 running vertically through the array in FIG. 2A. Two doped polysilicon conductors 116 and 122 run horizontally across the array. The four flash transistors occur at the intersections of polysilicon conductors 116 and 122 and p-well 112 and 114. Four floating gates 118, 120, 124 and 126 (associated with transistors T5, T6, T7 and T8 respectively) are shown with a heavy line defining their outer boundaries in FIG. 2A for ease of identification. Floating gates 118 and 120 are completely underneath polysilicon conductor 116 while floating gates 124 and 126 are completely underneath polysilicon conductor 122. In this embodiment, the polysilicon conductors 116 and 122 have crenellated edges on both sides, meaning they have wide areas called merlons and notches where the polysilicon has been removed called crenels 188. The crenellation pattern makes polysilicon conductors 116 and 118 wider over the field oxide regions and narrower inside active regions when offset a certain distance away from the field oxide. The merlons 186 and crenels 188 are only labeled on polysilicon conductor 116 to avoid excessively complicating the figure; however polysilicon conductor 122 and any other polysilicon conductors present in a larger array would have the same crenellation pattern as polysilicon conductor 116 and thus would be labeled identically.

Polysilicon conductors 116 and 122 divide p-well 112 into three separate source/drain regions 152, 154 and 156, which are coupled to a metal layer above the polysilicon conductors through contacts 164, 166 and 168. Similarly, polysilicon conductors 116 and 122 also divide p-well 114 into three separate source/drain regions 158, 160 and 162, which are coupled to a metal layer above the polysilicon conductors through contacts 170, 172 and 174. The symmetrical nature of transistor T5 allows source/drain region 152 to function as either the source terminal or the drain terminal of transistor T5. For example, if source/drain region 152 is the source then source/drain region 154 will be the drain, while if source/drain region 152 is the drain then source/drain region 154 will be the source. By convention, for n-channel transistors the source is the terminal operating at the lower voltage while the drain is the terminal operating at the higher voltage. If the terminal operating at the higher voltage changes during operation, then the source becomes the drain and vice versa. This is a function of the address, program, erase, and read circuits coupled to the array. Many such circuits suitable for use with the present invention are known in the art and are not discussed to avoid overcomplicating the disclosure. Similarly, the symmetrical nature of transistors T6, T7 and T8 allows the adjacent pairs of source/drain regions (158 and 160 for T6, 154 and 156 for T7, and 160 and 162 for T8) to function as either the source terminal or the drain terminal depending on their respective operating voltages.

Figure 2B:
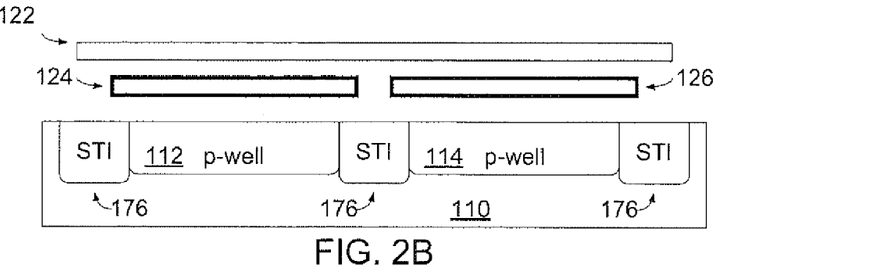
Figure 2C:
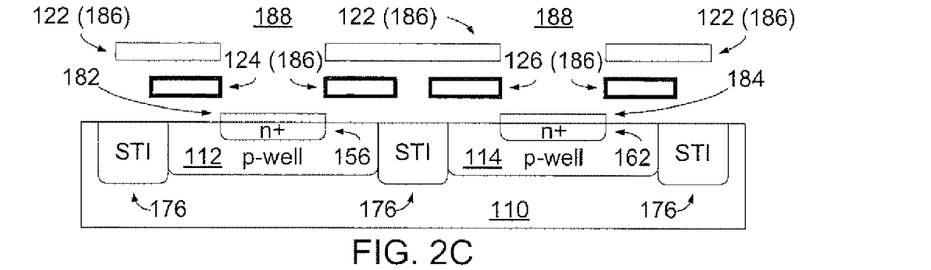
Figure 2D:
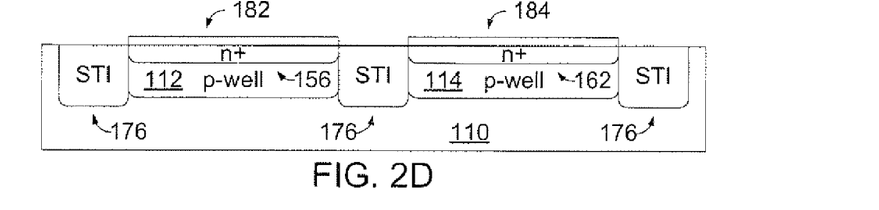

In order to more fully describe the three dimensional structure depicted in FIG. 2A, three cross sections in the planes designated by the dotted lines labeled FIG. 2B, FIG. 2C and FIG. 2D are shown in FIG. 2B, FIG. 2C and FIG. 2D respectively. Turning to FIG. 2B, substrate 110, p-wells 112 and 114, polysilicon conductor 122 and floating gates 124 and 126, which have been previously described, are shown. Also shown in FIG. 2B are Shallow Trench Isolation regions 176, which are the silicon dioxide (or field oxide) regions that isolate the p-wells 112 and 114 from each other and any other adjacent wells in conjunction with n-type substrate 110. Since the p-wells 112 and 114 are completely covered by polysilicon layer 122 and floating gates 124 and 126 respectively in this cross section, there is no n+ implant or salicide present in FIG. 2B.

FIG. 2C shows a cross section passing through the crenellation pattern of polysilicon conductor 122. Present in FIG. 2C are n-type substrate 110, p-wells 112 and 114, polysilicon conductor 122, floating gates 124 and 126, and STI regions 176 previously described. Because of the crenellation pattern, polysilicon conductor 122 is only present at the locations of the merlons 186 and is absent at the locations of the crenels 188. Thus polysilicon conductor 122 appears as three separate pieces in FIG. 2C. The floating gates 124 and 126, where present, are aligned with and underneath polysilicon conductor 122, so each of them also appears as two separate pieces in the figure.

Also present in FIG. 2C are source/drain regions 156 and 162, previously discussed, which are labeled n+ and covered with salicide layers 182 and 184 respectively. The active area only receives n+ implant and salicide in regions where the active area is exposed by the etch after the polysilicon masking step. Thus the portion of the source/drain regions 156 and 162 inside the crenels 188 are separated from the STI regions 176 on the sides of p-wells 112 and 114 respectively by the distance the merlons 186 overlap the p-wells 112 and 114. After the active regions are implanted and the salicide grown, more silicon dioxide is grown on top of the entire memory array and the processing continues until the integrated circuit is completely manufactured.

Turning to FIG. 2D the cross section includes substrate 110, p-wells 112 and 114, source regions 156 and 162, STI regions 176, and salicide layers 182 and 184 that have been previously described. As in FIG. 2C, source regions 156 and 162 also receive the n+ implant and get a layer of salicide wherever the active silicon forming p-wells 112 and 114 are exposed by the absence of polysilicon conductors. Because there is no polysilicon in the cross section illustrated in FIG. 2D, the n+ source region 156 and its salicide layer 182 extend completely across the width of p-well 112 from the STI region 176 on one side to the STI region 176 on the other. Similarly, the n+ source region 162 and its salicide layer 184 extend completely across the width of p-well 114.

Returning to the top view in FIG. 2A, all of the exposed source/drain regions 152, 154, 156, 158, 160 and 162 will receive the n+ implant and be covered with salicide because they are the active silicon regions not covered by polysilicon after the polysilicon mask etch. Each of the four transistors T5, T6, T7 and T8 has two source/drain regions associated with it, with the source/drain region 154 being shared by transistors T5 and T7 and the source region 160 being shared transistors T6 and T8.

Looking at transistor T7 in more detail, the distance between source/drain region 154 and source/drain region 156 is defined by the width of the polysilicon conductor 122 and the floating gate 124 between them. This distance is a matter of design choice, but at the location of the crenels 188 it will be at or near the minimum channel length the process design rules allow for flash transistors in any given design, since a short channel length is the most area efficient way to attain a transistor with strong current drive. Underneath the merlons 186, the channel length is substantially longer. Since short channel devices have lower threshold voltages than transistors laid out with a longer channel, the threshold voltage underneath floating gate 124 will vary with location. Areas between the crenels 188 will have lower threshold voltages than areas under the merlons 186, which are near the STI regions.

When the transistor T7 is turned on, a channel will form under the entire area under floating gate 124, but the degree of inversion will be significantly lower in the longer channel regions and significantly higher in the short channel areas. The current path through transistor T7 is from contact 166 to contact 168. Since the current will take the path of least resistance, the current will flow through the short channel region between crenels 188 and not approach the STI regions 176, since the short channel region provides a shorter path with a lower sheet resistance under the charge storage region than the longer channel regions. This is true even if a substantial number of positively charged particles lodged in the STI regions 176 under the merlons 186 are lowering the threshold voltage there.

When transistor T7 is turned off the increased threshold voltage in regions under the merlons 186 will counteract the effects of a substantial number of positively charged particles if they become lodged in the STI regions, since such trapped charges will tend to lower the threshold voltage in the active regions nearest the STI. This will substantially reduce the amount of leakage through transistor T7 and extend its useful lifetime in a radiation environment. Since the geometry of transistors T5, T6 and T8 is substantially identical to the geometry of transistor T7, they will show substantially identical behavior.

The embodiment in FIG. 2A employed conductive polysilicon floating gates as the charge storage layer, but the same device geometry can be employed using a non-conductive charge storage material like, for example, SONOS or silicon nanocrystals. In such an implementation, the floating gates 118 and 120 would be replaced by a continuous layer of charge storage material underneath and aligned with polysilicon conductor 116, which runs the length of the array. Similarly, floating gates 124 and 126 would be replaced by a continuous layer of charge storage material underneath and aligned with polysilicon conductor 122, which runs the length of the array. In the regions where polysilicon conductors 116 and 122 pass over active silicon, the charge storage region would function in a substantially similar fashion to the way the floating gates functioned in the embodiment of FIG. 2A. In the regions where polysilicon conductors 116 and 122 pass over STI regions 76, the charge storage layer would be present but there would be no way to add or remove charge and the non-conductivity of the layer would assure the independence of the charge storage regions of adjacent transistors disposed along a single polysilicon conductor. In such a flash transistor, the drive currents when on and the leakage currents when off would behave in substantially the same way.

If the charge storage region is conductive, the embodiment of FIG. 2A through FIG. 2D may be modified for use in a programmable logic device (PLD) as is shown in FIG. 3A through 3D. Because many of the structures in FIG. 3A through 3D are similar to structures previously discussed in conjunction with FIG. 2A through FIG. 2D, similar structures will have the same reference numbers in FIG. 3A through FIG. 3D.

Figure 3A:
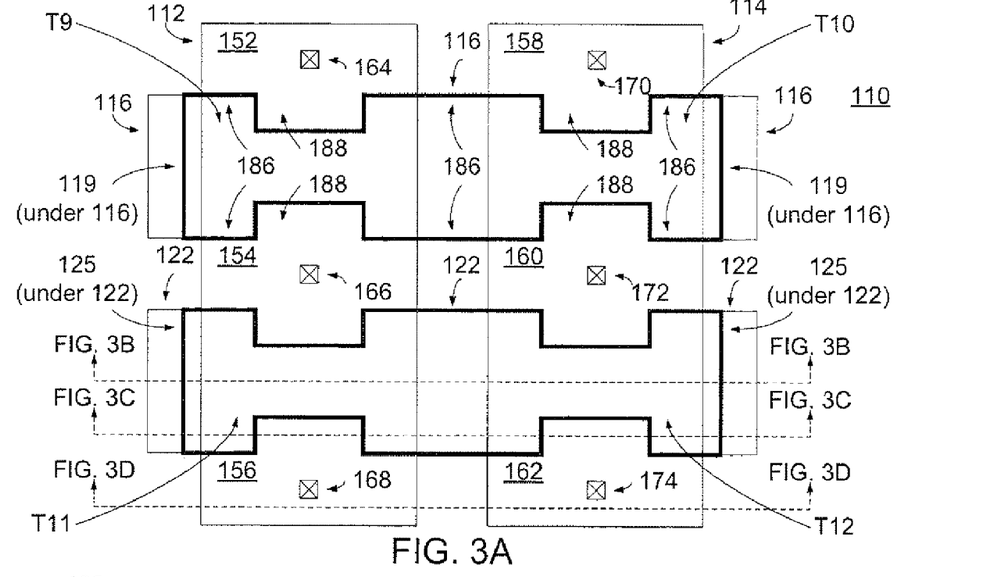
FIGS. 3A through 3D are, respectively, a top view and three cross-sectional views of a group of memory cells formed in accordance with the principles of the present invention.

Turning to FIG. 3A, an exemplary array of reduced-edge, radiation-tolerant, flash memory cells is shown in top view in an n-type silicon substrate 110. For simplicity, the array has four transistors T9, T10, T11 and T12 arranged in two rows and two columns, but other numbers of rows and columns may be used. Persons skilled in the art will realize that n-type substrate 110 may also be a deep n-well inside a p-type silicon substrate as a matter of design choice.

Also shown in FIG. 3A are p-wells 112 and 114, polysilicon conductors 116 and 122, source/drain regions 152, 154, 156, 158, 160 and 162, and contacts 164, 166, 168, 170, 172 and 174. Polysilicon conductors 116 and 122 are crenellated with merlons 186 and crenels 188. In FIG. 3A the conductive polysilicon floating gates 118 and 120 of FIG. 2A have been replaced by a single conductive polysilicon floating gate 119 and the conductive polysilicon floating gates 124 and 126 of FIG. 2A have been replaced by a single conductive polysilicon floating gate 125.

In this embodiment, two adjacent p-wells are paired together such that the two transistors in each row of the memory array in those columns are paired due to the shared floating gates. Each pair of transistors sharing a floating gate forms a single memory cell. Thus T9 and T10 comprise a first memory cell and T11 and T12 comprise a second memory cell. One transistor in each pair is a sense transistor and the other transistor is a switch transistor. The sense transistor is used to erase, program and read the state of the memory cell while the switch transistor is a programmable switch in the PLD. In embodiments with arrays comprising multiple columns of memory cells, switch transistors are disposed in columns with other switch transistors and sense transistors are disposed in columns with other sense transistors. All of the transistors in one column of switch transistors are paired together with all of the transistors in one adjacent column of sense transistors to form a column of memory cells. For example in FIG. 3A, transistors T9 and T11 in p-well 112 are the sense transistors and transistors T10 and T12 in p-well 114 are the switch transistors. Persons skilled in the art will realize that although p-wells 112 and 114 are drawn with the same width in FIG. 3A through FIG. 3D for ease of presentation, in a practical design they will most likely be different widths due to the transistors within them being optimized for the different tasks of sensing and switching.

Figure 3B:
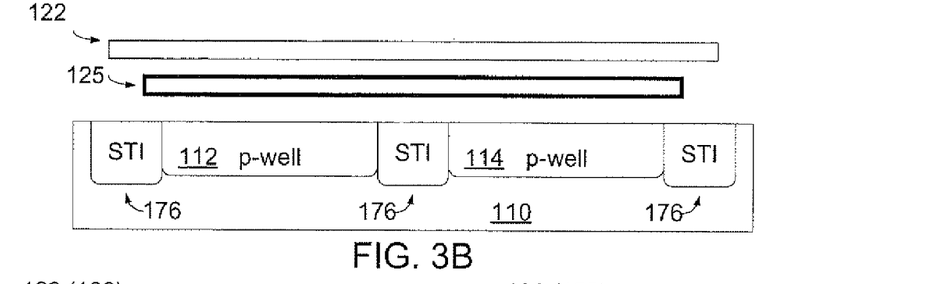
Figure 3C:
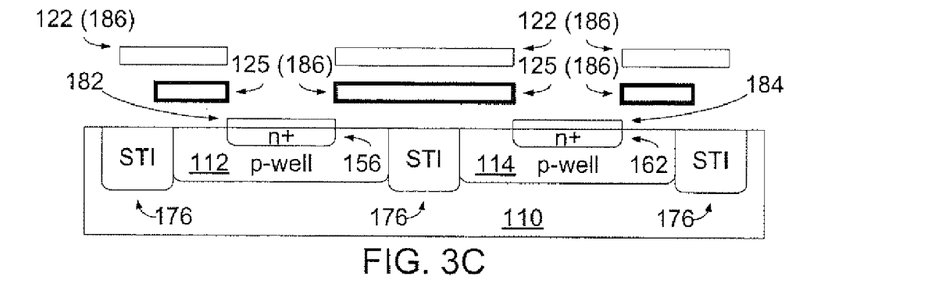
Figure 3D:
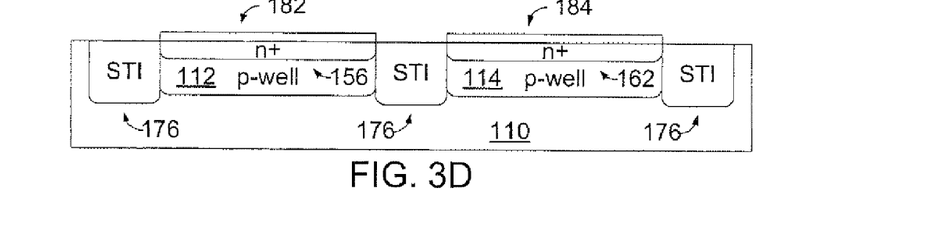

In order to more fully describe the three dimensional structure depicted in FIG. 3A, three cross sections in the planes designated by the dotted lines labeled FIG. 3B, FIG. 3C and FIG. 3D are shown in FIG. 3B, FIG. 3C and FIG. 3D respectively. Turning to FIG. 3B substrate 110, p-wells 112 and 114, polysilicon conductor 122, floating gate 125, and STI regions 176, which have been previously described are shown. Since the p-wells 112 and 114 are completely covered by polysilicon layer 122 and floating gate 125 in this cross section, there is no n+ implant or salicide present in FIG. 3B.

FIG. 3C shows a cross section passing through the crenellation pattern of polysilicon conductor 122. Present in FIG. 2C are n-type substrate 110, p-wells 112 and 114, polysilicon conductor 122, floating gate 125, source/drain regions 156 and 162, STI regions 176, and salicide layers 182 and 184 previously described. Because of the crenellation pattern, polysilicon conductor 122 and floating gate 125 are only present at the locations of the merlons 186 and are absent at the locations of the crenels 188. Thus polysilicon conductor 122 and floating gate 125 each appear as three separate pieces in FIG. 2C.

Also present in FIG. 3C are source/drain regions 156 and 162 previously discussed, which are labeled n+ and covered with salicide layers 182 and 184 respectively. The active area only receives n+ implant and salicide in regions where the active area is exposed by etching after the polysilicon masking step. Thus the portion of the source/drain regions 156 and 162 inside the crenels 188 are separated from the STI regions 176 on the sides of p-wells 112 and 114 respectively by the distance the merlons 186 overlap the p-wells 112 and 114. After the active regions are implanted and the salicide grown, more silicon dioxide is grown on top of the entire memory array and the processing continues until the integrated circuit is completely manufactured.

Turning to FIG. 3D the cross section includes substrate 110, p-wells 112 and 114, source/drain regions 156 and 162, STI regions 176, and salicide layers 182 and 184 that have been previously described. As in FIG. 3C, source regions 156 and 162 also receive the n+ implant and get a layer of salicide wherever the active silicon forming p-wells 112 and 114 are exposed by the absence of polysilicon conductors. Because there is no polysilicon in the cross section illustrated in FIG. 3D, the n+ source region 156 and its salicide layer 182 extend completely across the width of p-well 112 from the STI region 176 on one side to the STI region 176 on the other. Similarly, the n+ source region 162 and its salicide layer 184 extend completely across the width of p-well 114.

Returning to the top view in FIG. 3A, all of the source/drain regions 52, 54, 56, 58, 60 and 62 will receive the n+ implant and be covered with salicide because they are the portion of the active silicon regions not covered by polysilicon after the polysilicon mask etch. Each of the four transistors T9, T10, T11 and T12 has two source/drain regions associated with it, with the source/drain region 154 being shared by transistors T9 and T11 and the source/drain region 160 being shared transistors T10 and T12.

Looking at transistor T11 in more detail, the distance between source/drain region 154 and source/drain region 156 is defined by the width of the polysilicon conductor 122 and the floating gate 125 between them at the location of the crenels 188. This distance is a matter of design choice, but will be at or near the minimum channel length the process design rules allow for flash transistors in any given design, since a short channel length is the most area efficient way to attain a transistor with strong current drive. Underneath the merlons 186, the channel length is substantially longer. Since short channel devices have lower threshold voltages than transistors laid out with a longer channel, the threshold voltage underneath floating gate 125 will vary with location. Areas at the location of the crenels 188 will have lower threshold voltages than areas under the merlons 186, which are near the STI regions.

When the transistor T11 is turned on, a channel will form under the entire area under floating gate 124, but the degree of inversion will be significantly lower in the longer channel regions and significantly higher in the short channel areas. The current path through transistor T11 is from contact 166 to contact 168. Since the current will take the path of least resistance, the current will flow through the short channel region between crenels 188 and not approach the STI regions 176, since the short channel region provides a shorter path with a lower sheet resistance under the charge storage region than the longer channel regions. This is true even if a substantial number of positively charged particles are lodged in the STI regions 176 under the merlons 186.

When transistor T11 is turned off, the increased threshold voltage in regions under the merlons 186 will counteract the effects of a substantial number of positively charged particles if they become lodged in the STI regions, since such trapped charges will tend to lower the threshold voltage in the active regions nearest the STI. This will substantially reduce the amount of leakage through transistor T11 and extend its useful lifetime in a radiation environment. Since the geometry of transistors T9, T10 and T12 is substantially identical to the geometry of transistor T11, they will show substantially identical behavior. This is true even allowing for differences in the width and length of the short channel region between the sense transistors T9 and T11 and the switch transistors T10 and T12.

Figure 4A:
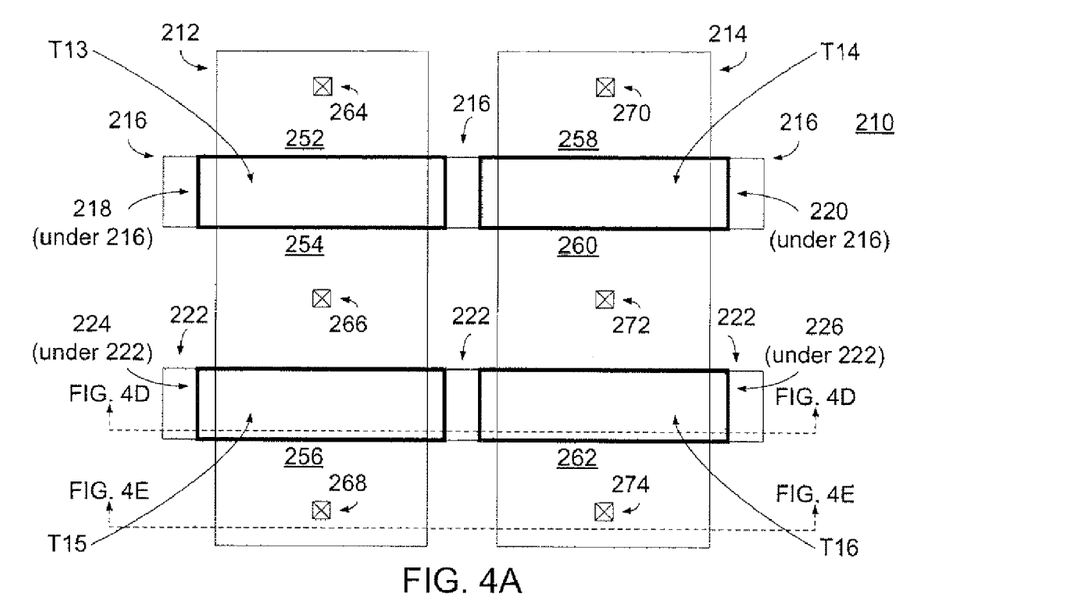
FIGS. 4A through 4E are, respectively, three top views and two cross-sectional views of a group of memory cells formed in accordance with the principles of the present invention.

Turning to FIG. 4A, an exemplary array of reduced-edge, radiation-tolerant, flash memory cells is shown in top view in an n-type silicon substrate 210. For simplicity, the array has four transistors T13, T14, T15 and T16 arranged in two rows and two columns, but other numbers of rows and columns may be used. Persons skilled in the art will realize that n-type substrate 210 may also be a deep n-well inside a p-type silicon substrate as a matter of design choice.

Substrate 210 contains two p-wells 212 and 214 running vertically through the array in FIG. 4A. Two doped polysilicon conductors 216 and 222 run horizontally across the array. The four flash transistors occur at the intersections of polysilicon conductors 216 and 222 and p-wells 212 and 214. Four floating gates 218, 220, 224 and 226 (associated with transistors T1, T2, T3 and T4 respectively) are shown with a heavy line defining their boundaries in FIG. 4A for ease of identification. Floating gates 218 and 220 are completely underneath and aligned to polysilicon conductor 216 while floating gates 224 and 226 are completely underneath and aligned to polysilicon conductor 222.

Polysilicon conductors 216 and 222 divide p-well 212 into three separate source/drain regions 252, 254 and 256, which are coupled to a metal layer above the polysilicon conductors through contacts 264, 266 and 268. Similarly, polysilicon conductors 216 and 222 also divide p-well 214 into three separate source/drain regions 258, 260 and 262, which are coupled to a metal layer above the polysilicon conductors through contacts 270, 272 and 274. The symmetrical nature of transistor T13 allows source/drain region 252 to function as either the source terminal or the drain terminal of transistor T13. If source region 252 is the source then source/drain region 254 will be the drain, while if source region 252 is the drain then source/drain region 254 will be the source. By convention, for n-channel transistors the source is the terminal operating at the lower voltage while the drain is the terminal operating at the higher voltage. If the terminal operating at the higher voltage changes during operation, then the source becomes the drain and vice versa. This is a function of the address, program, erase, and read circuits coupled to the array. Many such circuits suitable for use with the present invention are known in the art and are not discussed to avoid overcomplicating the disclosure. Similarly, the symmetrical nature of transistors T14, T15 and T16 allows the adjacent pairs of source/drain regions (258 and 260 for T14, 254 and 256 for T15, and 260 and 262 for T16) to function as either the source terminal or the drain terminal depending on their respective operating voltages.

Figure 4B:
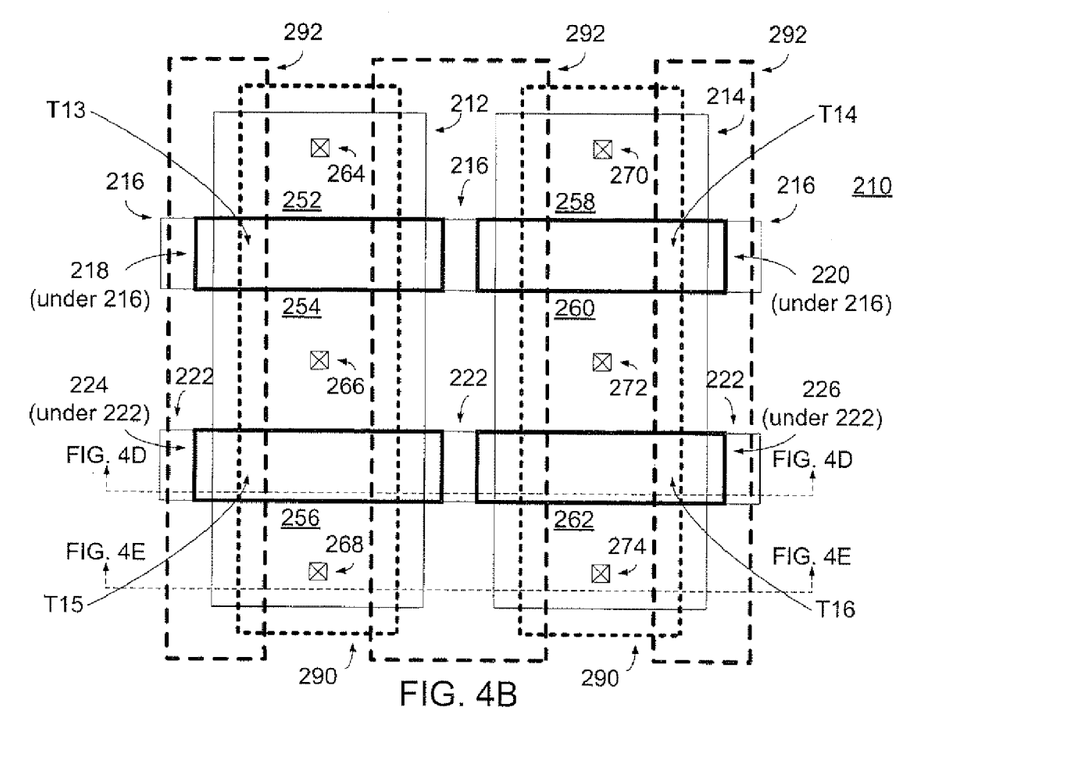

FIG. 4B presents a top view of the exemplary array of FIG. 4A with additional details shown. Present are n-type substrate 210, p-wells 212 and 214, polysilicon conductors 216 and 218, floating gates 218, 220, 224 and 226, source/drain regions 252, 254, 256, 258, 260 and 262, and contacts 264, 266, 268, 270, 272 and 274 that have been previously discussed. Also shown are the locations where the n+ mask objects 290 will allow n+ implantation to occur. These n+ mask objects 290 are depicted in the figure by the rectangles labeled 290 drawn in thick dotted lines. With normal processing, the entire array of n-channel flash transistors would be within a single large n+ implantation area. In this embodiment, the n+ implant is controlled to only implant a portion of the active area in p-wells 212 and 214. Each well has its own n+ mask object 290 that runs its entire length. It may overlap the field oxide at the ends as shown in the figure, but is inside the p-well areas 212 and 214 away from the field oxide on the sides of the p-wells 212 and 214. The n+ implant only occurs in active area exposed after the polysilicon mask etch and consequently does not occur in the active are under polysilicon conductors 216 and 222. Persons skilled in the art will appreciate that mask objects are not part of the final integrated circuit. Rather they correspond to areas of a mask that will be used to develop a layer of photoresist deposited on the semiconductor surface, which will only allow the desired processing at those locations. In that sense, the mask objects represent the designer's intention for the final integrated circuit.

Also shown in FIG. 4B are the locations where the salicide block mask objects 292 will prevent salicide from forming on top of the active area defined by p-wells 212 and 214. The salicide block mask objects are depicted as rectangles labeled 292 drawn in thick dashed lines. Since this is a blocking layer, the salicide block mask defines regions where salicide cannot be grown. Three salicide block mask objects 292 are shown in FIG. 4B. They prevent salicide from being deposited in the side areas of the p-wells 212 and 214. The salicide block mask objects 292 extend far enough into the p-wells 212 and 214 to overlap the n+ mask object 209 areas. Since the salicide is conductive, there must be sufficient overlap so that the salicide deposited on top of the n+ implant areas is sufficiently inside the n+ areas so as to not electrically short circuit the n+ implanted source/drain regions 252, 254, 256, 258, 260 and 262 to the non-implanted areas of p-wells 212 and 214.

Figure 4C:
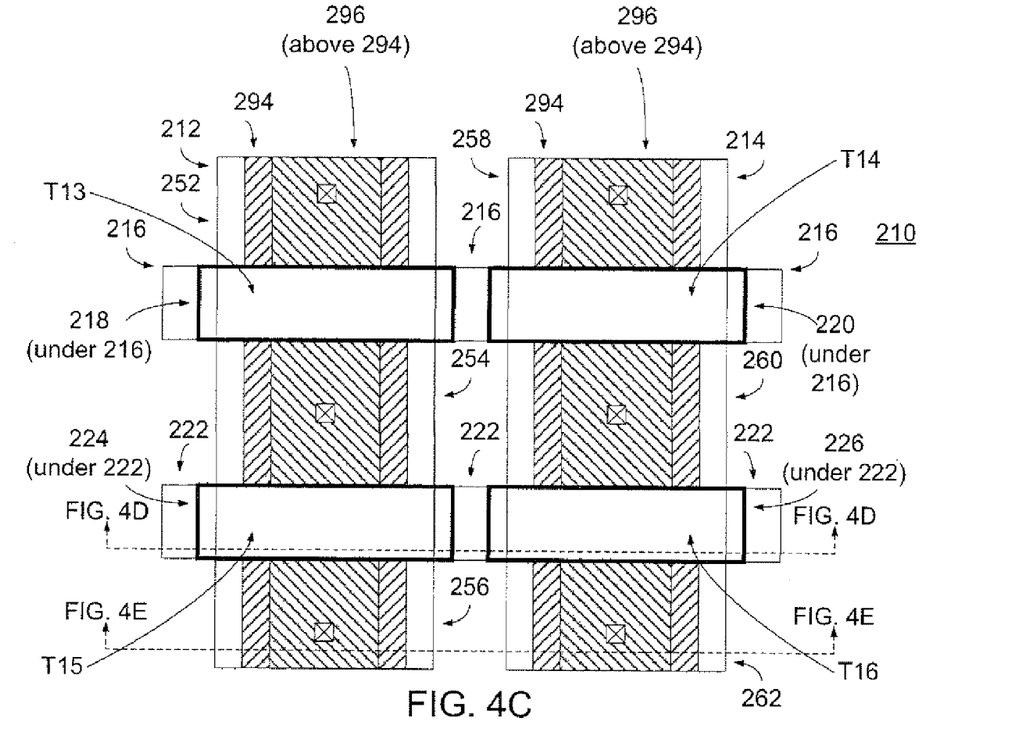

FIG. 4C is a top view of the exemplary array of FIG. 4A and FIG. 4B that illustrates more details of the physical structure. Present are n-type substrate 210, p-wells 212 and 214, polysilicon conductors 216 and 222, floating gates 218, 220, 224 and 226, source/drain regions 252, 254, 256, 258, 260 and 262, and contacts 264, 266, 268, 270, 272 and 274 that have been previously discussed, though the reference numbers for the contacts have been removed from FIG. 4C to avoid needlessly complicating the figure. Also shown in FIG. 4C are the n+ implant areas 294 and the salicide areas 296.

In FIG. 4C, the n+ implant areas 294 are shown with a lower left to upper right cross hatching while the salicide areas 296 are shown with a upper left to lower right cross hatching. Salicide areas 296 have an n+ implant area 294 underneath, even though the lower left to upper right cross hatching is not shown to avoid making the figure hard to see or understand. There are a total of six salicide areas 296 and six n+ implant areas 294 present in FIG. 4C, though only two examples of each are labeled. Each of the six n+ implant areas 294 is associated with one of the six source/drain regions 252, 254, 256, 258, 260 and 262. Similarly, each of the six salicide areas 296 is associated with one of the six n+ implant areas 294.

Figure 4D:
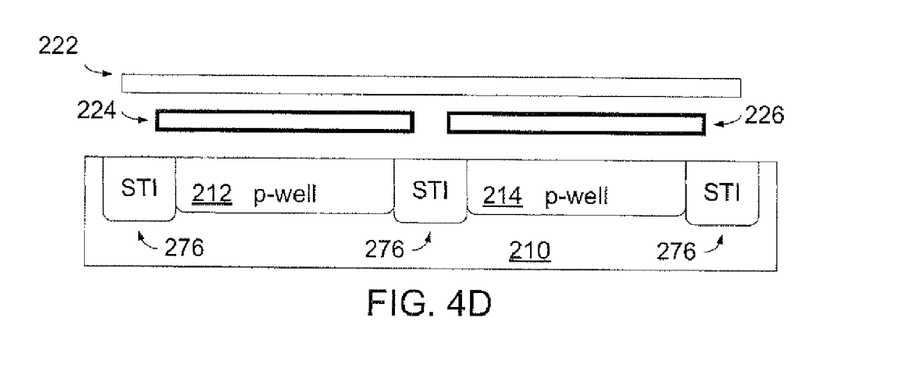
Figure 4E:
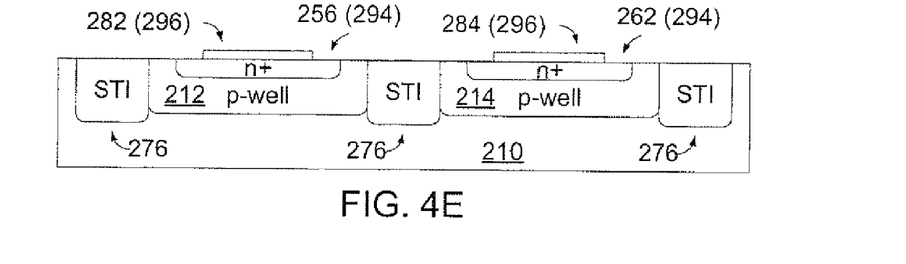

In order to more fully describe the three dimensional structure depicted in FIG. 4A, FIG. 4B and FIG. 4C, two cross sections in the planes designated by the dotted lines labeled FIG. 4D and FIG. 4E in the figures are shown in FIG. 4D and FIG. 4E respectively. Turning to FIG. 4D, shown are substrate 210, p-wells 212 and 214, polysilicon conductor 222 and floating gates 224 and 226 that have been previously described. Also shown in FIG. 4D are Shallow Trench Isolation regions 276, which are the silicon dioxide (or field oxide) regions that isolate the p-wells 212 and 214 from each other and any other adjacent wells in conjunction with n-type substrate 210. Since the p-wells 212 and 214 are covered by polysilicon layer 222 and floating gates 224 and 226 respectively in this cross section, there is no n+ implant or salicide present in FIG. 4D.

Turning to FIG. 4E, the cross section shown includes substrate 210, p-wells 212 and 214, source regions 256 and 262, and STI regions 276 that have been previously described. Source/drain region 256 receives the n+ implant 294 wherever the n+ implant mask objects 290 designate and gets a layer of salicide 282 (296) wherever the salicide blocking mask objects 292 designate. Because of the presence of the n+ implant mask objects 290 and the salicide block mask objects 292 over active p-well region 212, the n+ implant region 256 (294) is offset away from the STI region 276 on both sides of p-well 212 and its salicide layer 282 (296) is offset from the boundary of the n+ implant region 256 and p-well 212. Similarly, the n+ implant region 262 (294) is offset away from the STI region 276 on both sides of p-well 214 and its salicide layer 284 (296) is offset from the boundary of the n+ implant region 262 and p-well 212.

Returning to the top view in FIG. 4C, all of the exposed source/drain regions 252, 254, 256, 258, 260 and 262 are offset away from the boundaries of the sides of the p-wells and the surrounding STI field oxide regions and all of the salicide layers 296 on top of the source/drain regions 252, 254, 256, 258, 260 and 262 are offset away from the boundaries of the source/drain regions with the surrounding p-wells. Each of the four transistors T13, T14, T15 and T16 has two source/drain regions associated with it, with the source/drain region 254 being shared by transistors T13 and T15 and the source region 260 being shared transistors T14 and T16.

Looking at transistor T15 in more detail, the distance between source/drain region 254 and source/drain region 256 is defined by the width of the polysilicon conductor 222 and the floating gate 224 between them. This distance is a matter of design choice, but will be at or near the minimum channel length the process design rules allow for flash transistors in any given design, since a short channel length is the most area efficient way to attain a transistor with strong current drive. In this embodiment, the polysilicon conductors have no unusual geometries and pass straight across the p-well regions 212 and 214. This means that there will be no difference in the threshold voltage of transistor T15 anywhere under the floating gate 224. The radiation hardening is due to the offset of the n+ implant areas of source/drain regions 254 and 256.

When the transistor T15 is turned on, a channel will form under the entire area under floating gate 224. The current path through transistor T5 is from contact 266 to contact 268. Since the current will take the path of least resistance, the current will flow in a direct path between source/drain regions 254 and 256 and not approach the STI regions 176 if the offset is sufficiently large. This is true even if a substantial number of positively charged particles are lodged in the STI regions 276 under polysilicon conductor 222 strengthening the degree of inversion and lowering the threshold voltage in those areas.

When transistor T15 is turned off, the offset of the n+ implants areas 254 and 256 from the STI regions 176 will counteract the effects of a substantial number of positively charged particles if they become lodged in the STI regions 276 due to the lack of a current path. While the threshold voltage will drop near the STI region 276 boundary underneath floating gate 225 causing a potential subthreshold condition or even weak inversion, the only potential conduction path will be at the edges of p-well 212 adjacent to the STI regions 276. Since the n+ source/drain regions 254 and 256 are sufficiently offset from the STI region 276 boundary, the potential conduction path will not reach them. This will substantially reduce the amount of leakage through transistor T15 and extend its useful lifetime in a radiation environment. Since the geometry of transistors T13, T14 and T16 is substantially identical to the geometry of transistor T15, they will show substantially identical behavior.

If the charge storage region is conductive, the embodiment of FIG. 4A through FIG. 4E may be modified for use in a programmable logic device (PLD) as is shown in FIG. 5A through 5E. Because many of the structures in FIG. 5A through 5E are similar to structures previously discussed in conjunction with FIG. 4A through FIG. 4E, similar structures will have the same reference numbers in FIG. 5A through FIG. 5E.

Figure 5A:
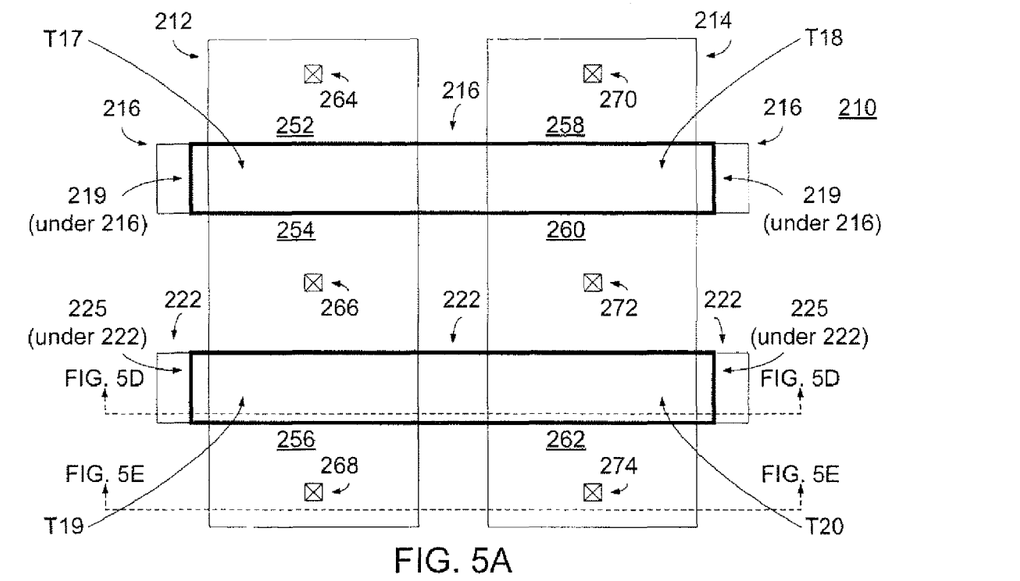
FIGS. 5A through 5E are, respectively, three top views and two cross-sectional views of a group of memory cells formed in accordance with the principles of the present invention.

Turning to FIG. 5A, an exemplary array of reduced-edge, radiation-tolerant, flash memory cells is shown in top view in an n-type silicon substrate 210. For simplicity, the array has four transistors T17, T18, T19 and T20 arranged in two rows and two columns, but other numbers of rows and columns may be used. Persons skilled in the art will realize that n-type substrate 210 may also be a deep n-well inside a p-type silicon substrate as a matter of design choice.

Also shown in FIG. 5A are p-wells 212 and 214, conductors 216 and 222 source/drain regions 252, 254, 256, 258, 260 and 262, and contacts 264, 266, 268, 270, 272 and 274 as previously discussed in conjunction with FIG. 4A through FIG. 4E. The conductive polysilicon floating gates 218 and 220 have been replaced by a single floating gate 219 shared by transistors T17 and T18 while the conductive polysilicon floating gates 224 and 226 have been replaced by a single floating gate 225 shared by transistors T19 and T20.

In this embodiment, two adjacent p-wells are paired together such that the two transistors in each row of the memory array in those columns are paired due to the shared floating gates. Each pair of transistors sharing a floating gate forms a single memory cell. Thus transistors T17 and T18 comprise a first memory cell and transistors T19 and T20 comprise a second memory cell. One transistor in each pair is a sense transistor and the other transistor is designated the switch transistor. The sense transistor is used to erase, program and read the state of the memory cell while the switch transistor is a programmable switch in the PLD. All of the switch transistors are in one column and all of the sense transistors are in the other. In FIG. 5A, transistors T17 and T19 in p-well 212 are the sense transistors and transistors T18 and T20 in p-well 214 are the switch transistors. In embodiments with arrays comprising multiple columns of memory cells, switch transistors are disposed in columns with other switch transistors and sense transistors are disposed in columns with other sense transistors. All of the transistors in one column of switch transistors are paired together with all of the transistors in one adjacent column of sense transistors to form a column of memory cells. Persons skilled in the art will realize that although p-wells 212 and 214 are drawn with the same width in FIG. 5A through FIG. 5E for ease of presentation, in a practical design they will most likely be different widths due to the transistors within them being optimized for the different tasks of sensing and switching.

Figure 5B:
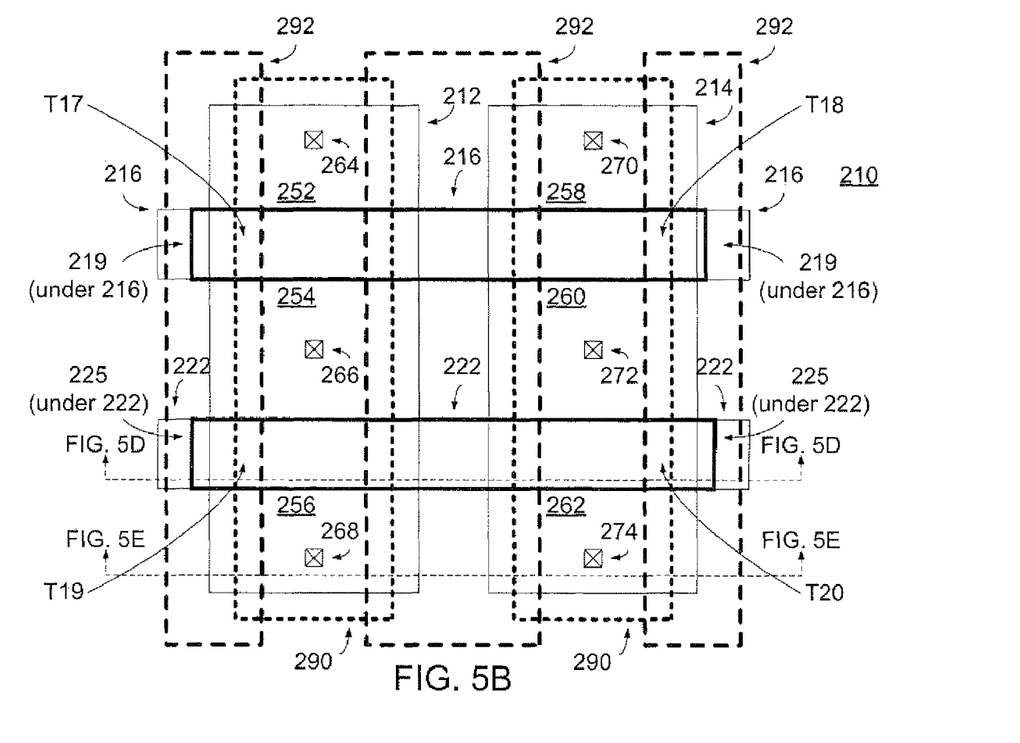

FIG. 5B presents a top view of the exemplary array of FIG. 5A with additional details shown. Present are n-type substrate 210, p-wells 212 and 214, polysilicon conductors 216 and 218, floating gates 219 and 225, source/drain regions 252, 254, 256, 258, 260 and 262, contacts 264, 266, 268, 270, 272 and 274, n+ implant mask objects 290, and salicide block mask objects 292 that have been previously discussed.

Figure 5C:
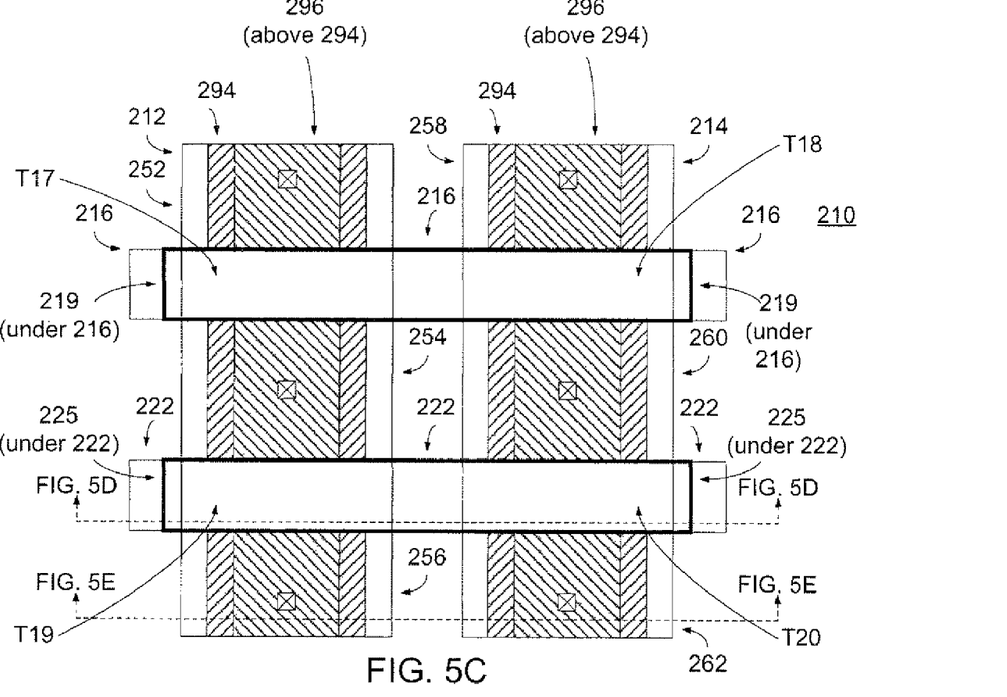

FIG. 5C is a top view of the exemplary array of FIG. 5A and FIG. 5B that illustrates more details of the physical structure. Present are n-type substrate 210, p-wells 212 and 214, polysilicon conductors 216 and 222, floating gates 218, 220, 224 and 226, source/drain regions 252, 254, 256, 258, 260 and 262, and contacts 264, 266, 268, 270, 272 and 274 that have been previously discussed, though the reference numbers for the contacts have been removed from FIG. 5C to avoid needlessly complicating the figure.

Also shown in FIG. 5C are the n+ implant areas 294 resulting from applying the n+ mask objects 290 and the salicide areas 296 resulting from applying the salicide blocking mask objects 292. The n+ implant areas 294 are shown with a lower left to upper right cross hatching while the salicide areas 296 are shown with a upper left to lower right cross hatching. Salicide areas 296 have an n+ implant area 294 underneath, even though the lower left to upper right cross hatching is not present to avoid making the figure hard to see or understand. There are a total of six salicide areas 296 and six n+ implant areas 294 present in FIG. 5C, though only two examples of each are labeled. Each of the six n+ implant areas 294 is associated with one of the six source/drain regions 252, 254, 256, 258, 260 and 262. Similarly, each of the six salicide areas 296 is associated with one of the six n+ implant areas 294.

Figure 5D:
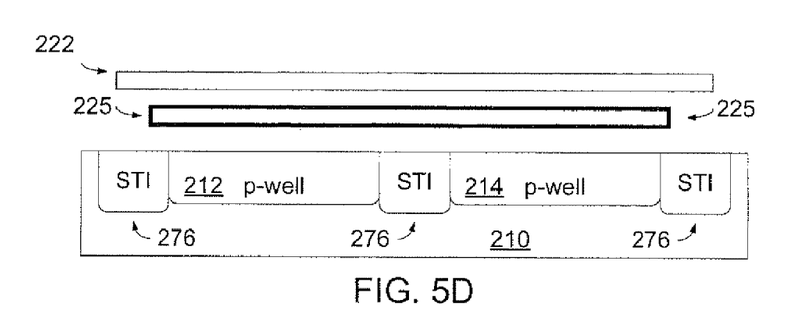
Figure 5E:
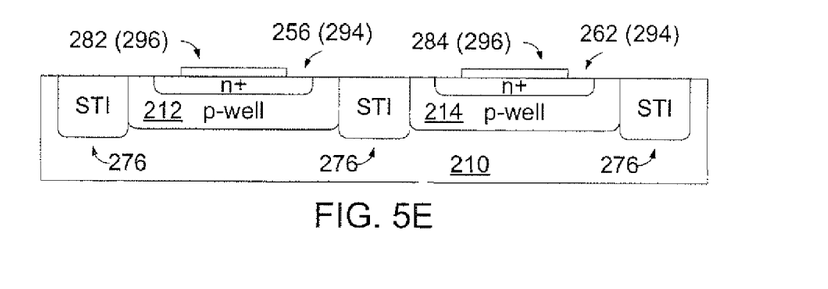

In order to more fully describe the three dimensional structure depicted in FIG. 5A, FIG. 5B and FIG. 5C, two cross sections in the planes designated by the dotted lines labeled FIG. 5D and FIG. 5E in the figures are shown in FIG. 5D and FIG. 5E respectively. Turning to FIG. 5D, shown are substrate 210, p-wells 212 and 214, polysilicon conductor 222 and floating gate 225 that have been previously described. Also shown in FIG. 5D are Shallow Trench Isolation regions 276, which are the silicon dioxide (or field oxide) regions that isolate the p-wells 212 and 214 from each other and any other adjacent wells in conjunction with n-type substrate 210. Since the p-wells 212 and 214 are completely covered by polysilicon layer 222 and floating gate 225 respectively in this cross section, there is no n+ implant or salicide present in FIG. 5D.

Turning to FIG. 5E, the cross section shown includes substrate 210, p-wells 212 and 214, source regions 256 and 262, and STI regions 276 that have been previously described. Source/drain region 156 receives the n+ implant 294 wherever the n+ implant mask objects 290 designate and a layer of salicide 282 wherever the salicide blocking mask objects 292 designate. Because of the presence of the n+ implant mask objects 290 and the salicide block mask objects 292 over active p-well region 212, the n+ implant region 256 (294) is offset away from the STI region 276 on both sides of p-well 212 and its salicide layer 282 (296) is offset from the boundary of the n+ implant region 256 and p-well 212. Similarly, the n+ implant region 262 (294) is offset away from the STI region 276 on both sides of p-well 214 and its salicide layer 284 (294) is offset from the boundary of the n+ implant region 262 and p-well 212.

Returning to the top view in FIG. 5C, all of the exposed source/drain regions 252, 254, 256, 258, 260 and 262 are offset away from the boundaries of the sides of the p-wells and the surrounding STI field oxide regions and all of the salicide layers 296 on top of the source/drain regions 252, 254, 256, 258, 260 and 262 are offset away from the boundaries of the source/drain regions with the surrounding p-wells. Each of the four transistors T17, T18, T19 and T20 has two source/drain regions associated with it, with the source/drain region 254 being shared by transistors T13 and T15 and the source region 260 being shared transistors T14 and T16.

Looking at transistor T19 in more detail, the distance between source/drain region 254 and source/drain region 256 is defined by the width of the polysilicon conductor 222 and the floating gate 225 between them. This distance is a matter of design choice, but will be at or near the minimum channel length the process design rules allow for flash transistors in any given design, since a short channel length is the most area efficient way to attain a transistor with strong current drive. In this embodiment, the polysilicon conductors have no unusual geometries and pass straight across the p-well regions 212 and 214. This means that there will be no difference in the threshold voltage of transistor T19 anywhere under the floating gate 225. The radiation hardening is due to the offset of the n+ implant areas of source/drain regions 254 and 256.

When the transistor T15 is turned on, a channel will form under the entire area under floating gate 225. The current path through transistor T5 is from contact 266 to contact 268. Since the current will take the path of least resistance, the current will flow in a direct path between source/drain regions 254 and 256 and not approach the STI regions 176 if the offset is sufficiently large. This is true even if a substantial number of positively charged particles are lodged in the STI regions 276 under the polysilicon conductor 222 strengthening the degree of inversion and lowering the threshold voltage in those areas.

When transistor T19 is turned off, the offset of the n+ implant areas 254 (294) and 256 (294) from the STI regions 176 will counteract the effects of a substantial number of positively charged particles if they become lodged in the STI regions due to the lack of a current path. While the threshold voltage underneath floating gate 225 will drop near the STI causing a potential subthreshold condition or even weak inversion, the only potential conduction path will be at the edges of p-well 212 adjacent to the STI regions 276. Since the n+ source/drain regions 254 and 256 are sufficiently offset from the STI region 276 boundary, the potential conduction path will not reach them. This will substantially reduce the amount of leakage through transistor T19 and extend its useful lifetime in a radiation environment. Since the geometry of transistors T17, T18 and T20 is substantially identical to the geometry of transistor T15, they will show substantially identical behavior.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A reduced-edge flash transistor, comprising:
    (a) an active region bounded by a shallow trench isolation region;
    (b) a control gate overlaying a portion of the active region;
    (c) a charge storage region disposed above the active region and aligned with and underneath the control gate for at least that portion of the control gate overlaying the active region;
    (d) a conductively doped source region comprising a first portion of the active region that is not overlaid by the control gate and charge storage region; and
    (e) a conductively doped drain region comprising a second portion of the active region that is not overlaid by the control gate and charge storage region, wherein:
        (i) the source region and the drain region are positioned with respect to each other so that current passes from the drain region to the source region through a channel region underneath the charge storage region when the transistor is in the on state,
        (ii) the current does not approach the shallow trench isolation region at edges of the channel region.

2. The reduced-edge flash transistor of claim 1, wherein the drain region is laterally surrounded by the active region on all sides.

3. The reduced-edge flash transistor of claim 2, wherein the charge storage region comprises a conductive material.

4. The reduced-edge flash transistor of claim 3, wherein the conductive material comprises polysilicon.

5. The reduced-edge flash transistor of claim 2, wherein the charge storage region comprises a non-conductive material.

6. The reduced-edge flash transistor of claim 5, wherein the non-conductive material comprises SONOS.

7. The reduced-edge flash transistor of claim 5, wherein the non-conductive material comprises silicon nanocrystals.

8. The reduced-edge flash transistor of claim 1, wherein the widths of the control gate and the charge storage region are wider at the edge of the active region than they are over at least a portion of the remainder of the active region.

9. The reduced-edge flash transistor of claim 8, wherein the charge storage region comprises a conductive material.

10. The reduced-edge flash transistor of claim 9, wherein the conductive material comprises polysilicon.

11. The reduced-edge flash transistor of claim 8, wherein the charge storage region comprises a non-conductive material.

12. The reduced-edge flash transistor of claim 11, wherein the non-conductive material comprises SONOS.

13. The reduced-edge flash transistor of claim 11, wherein the non-conductive material comprises silicon nanocrystals.

14. The reduced-edge flash transistor of claim 1, wherein the source region and the drain region are each laterally surrounded by the active region on all sides.

15. The reduced-edge flash transistor of claim 14, wherein:
   (a) a conductive layer is disposed on top of the source and drain regions; and
   (b) the source region and the drain region both remain electrically isolated from the surrounding active region.

16. The reduced-edge flash transistor of claim 15, wherein the conductive layer comprises metal silicide.

17. The reduced-edge flash transistor of claim 1, wherein the control gate and charge storage region are annular and surround the drain region, a distance between the source region and the drain region being shorter than a distance between the drain region and the shallow trench isolation region.

* * * * *